(12) United States Patent
Park et al.

(10) Patent No.: US 9,954,484 B2
(45) Date of Patent: Apr. 24, 2018

(54) SOLAR BATTERY MODULE (71) Applicant: LG INNOTEK CO., LTD., Seoul (KR)

(72) Inventors: Kyung Eun Park, Seoul (KR); Sung Bum Choi, Seoul (KR); Chi Hong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/022,771

(22) PCT Filed: Sep. 17, 2014

(86) PCT No.: PCT/KR2014/008658
§ 371 (c)(1),
(2) Date: Mar. 17, 2016

(87) PCT Pub. No.: WO2015/041463
PCT Pub. Date: Mar. 26, 2015

(65) Prior Publication Data
US 2016/0233345 A1 Aug. 11, 2016

(30) Foreign Application Priority Data
Sep. 17, 2013 (KR) .................. 10-2013-0111900

(51) Int. Cl.
*H01L 31/044* (2014.01)
*H01L 31/05* (2014.01)
(Continued)

(52) U.S. Cl.
CPC .......... *H02S 40/34* (2014.12); *H01L 31/0201* (2013.01); *H01L 31/02021* (2013.01);
(Continued)

(58) Field of Classification Search
CPC ............ H01L 31/0201; H01L 31/0504; H01L 31/048; H01L 31/0445; H01L 31/044;
(Continued)

(56) References Cited

U.S. PATENT DOCUMENTS

| 2005/0011551 A1 | 1/2005 | Simburger et al. |
| 2010/0043862 A1* | 2/2010 | Croft ............... H01L 31/05 136/244 |

(Continued)

FOREIGN PATENT DOCUMENTS

| CN | 102714249 A | 10/2012 |
| CN | 102820359 A | 12/2012 |
| KR | 1020120045633 A | 5/2010 |

OTHER PUBLICATIONS

International Search Report in International Application No. PCT/KR2014/008658, filed Sep. 17, 2014.
Office Action dated Jan. 19, 2017 in Chinese Appllication No. 201480051413.0.

*Primary Examiner* — Jeffrey T Barton
*Assistant Examiner* — Michael Y Sun
(74) *Attorney, Agent, or Firm* — Saliwanchik, Lloyd & Eisenschenk (57) ABSTRACT A solar battery module according to an embodiment comprises: a support substrate; a plurality of solar battery cells arranged on the support substrate; and at least one bus bar electrically connected with the solar battery cells, wherein the support substrate includes at least two cut regions formed at corner regions thereof and the bus bar is extended to the rear side of the supporting substrate from the front side of the supporting substrate through the cut regions.

9 Claims, 8 Drawing Sheets (51) Int. Cl.
*H02S 40/34* (2014.01)
*H01L 31/02* (2006.01)
*H02S 40/42* (2014.01)
*H01L 31/048* (2014.01)
*H02S 40/36* (2014.01)
*H01L 31/0445* (2014.01)
*H01L 31/052* (2014.01)

(52) U.S. Cl.
CPC .......... *H01L 31/044* (2014.12); *H01L 31/048* (2013.01); *H01L 31/0445* (2014.12); *H01L 31/0504* (2013.01); *H02S 40/36* (2014.12); *H02S 40/42* (2014.12); *H01L 31/05* (2013.01); *H01L 31/052* (2013.01); *Y02E 10/50* (2013.01)

(58) Field of Classification Search
CPC ............... H01L 31/0547; H01L 31/042; H01L 31/02021; H01L 31/05; H01L 31/052; H02S 40/36; H02S 40/34; H02S 40/42; Y02E 10/50; F24J 2/485; F24J 2/38; F24J 2/07

See application file for complete search history.

(56) References Cited

U.S. PATENT DOCUMENTS

| | | |
|---|---|---|
| 2010/0218805 A1 | 9/2010 | Everett et al. |
| 2011/0155209 A1 | 6/2011 | Tober et al. |
| 2011/0271999 A1* | 11/2011 | Almogy ............... F24J 2/07 136/246 |
| 2011/0308562 A1 | 12/2011 | Shufflebotham |
| 2012/0279548 A1 | 11/2012 | Münch et al. |
| 2013/0092216 A1* | 4/2013 | Yan ................. H02S 50/10 136/251 |

* cited by examiner

SOLAR BATTERY MODULE

FIELD

The embodiment relates to a solar battery module.

BACKGROUND

Recently, as the depletion of an energy resource such as petroleum or coal is expected, the interest in the substitute energy has been more increased. In this regard, a solar cell converting solar energy into electrical energy has been spotlighted.

A solar cell (or photovoltaic cell) is a core element in solar power generation to directly convert solar light into electricity.

For example, if the solar light having energy greater than band-gap energy of a semiconductor is incident into a solar cell having the PN junction structure of a semiconductor, electron-hole pairs are generated. As electrons and holes are collected into an N layer and a P layer, respectively, due to the electric field formed in a PN junction part, photovoltage is generated between the N and P layers. In this case, if a load is connected to electrodes provided at both ends of the solar cell, current flows through the solar cell.

The current generated from the solar cell is transferred to a junction box through a bus bar. In general, the bus bar is formed on the front surface of a solar cell panel and extends to a rear surface of the solar cell panel through a hole formed in the solar cell panel to allow the current to flow into the junction box.

However, since the hole is formed in the panel, the durability and reliability of the panel are deteriorated. As the size of the panel is enlarged, the problems become serious.

In this regard, there has been suggested a method of increasing the thickness of a solar cell panel to prevent the panel from being bent or damaged, but this method may cause the increase in the weight of the solar cell panel and make the process complex.

Therefore, there is a need to provide a solar cell module having a novel structure capable of improving the durability and reliability of the solar cell panel when a bus bar is formed on the solar cell panel.

DISCLOSURE

Technical Problem

The embodiment provides a solar cell module which can be easily manufactured and have improved reliability and durability.

Technical Solution

According to the embodiment, there is provided a solar battery module including a support substrate, a plurality of solar cells on the support substrate, and at least one bus bar electrically connected with the solar cells. The support substrate includes at least two cut regions in a corner region, and the bus bar extends from a front surface of the support substrate to a rear surface of the support substrate through the cut region.

Advantageous Effects

As described above, according to the solar battery module of the embodiment, the bus bar may extend from the front surface of the solar cell panel to the rear surface of the solar cell panel through the cut region formed at the corner region of the support substrate.

In other words, the bus bar can directly extend from the front surface of the solar cell panel to the rear surface of the solar cell panel without any connection passages such as holes formed in the support substrate.

According to the related art, a through-hole is formed through the support substrate, and the bus bar extends to the rear surface of the support substrate through the through-hole. However, due to the through-hole, the durability of the support substrate is deteriorated. In addition, as a size of the solar cell panel is enlarged, the solar cell panel may be damaged or warped caused by deterioration of the durability.

Therefore, according to the solar cell module of the embodiment, the bus bar directly extends from the front surface of the solar cell panel to the rear surface of the solar cell panel without through-holes formed in the support substrate, so that the durability of the solar cell module can be improved.

Therefore, the solar cell module according to the embodiment may be prevented from being bent or warped.

BEST MODE

Mode for Invention

In the following description of the embodiments, it will be understood that, when a layer (film), a region, a pattern or a structure is referred to as being "on" or "under" a substrate, another layer (film), another region, another pad or other patterns, it can be "directly" or "indirectly" on the other layer (film), region, pattern or structure, or one or more intervening layers may also be present. Such a position of each layer described with reference to accompanying drawings.

The thicknesses or sizes of each layer (film), region, pattern or structures shown in the drawings may be exaggerated for the purpose of explanation and clarity, and may not utterly reflect the actual size.

Hereinafter, the embodiments of the disclosure will be described in detail with reference to accompanying drawings.

Figure 1:
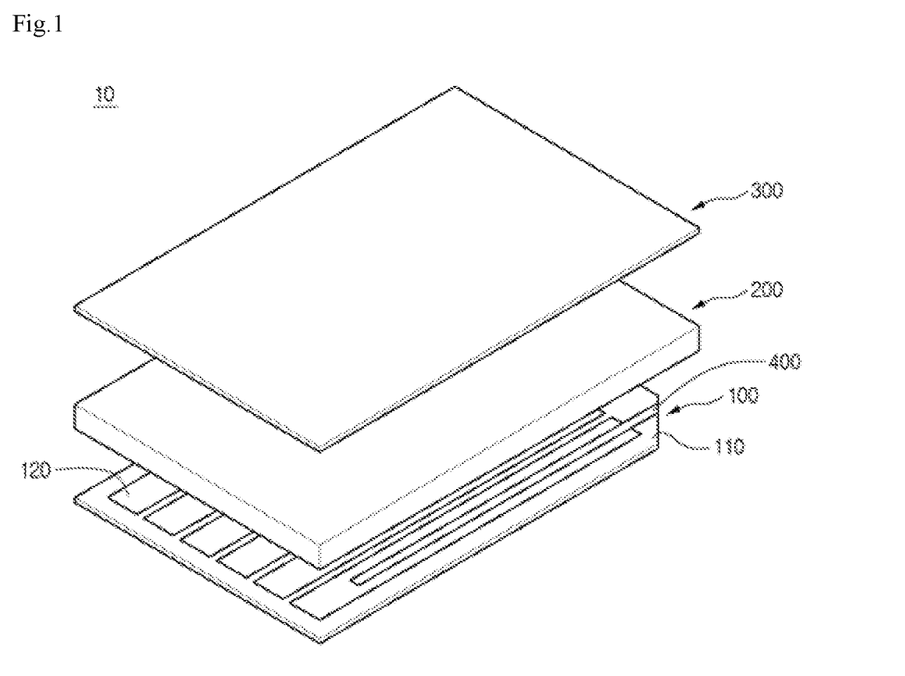
FIG. 1 is an exploded perspective view showing a solar cell module according to an embodiment.
Figure 2:
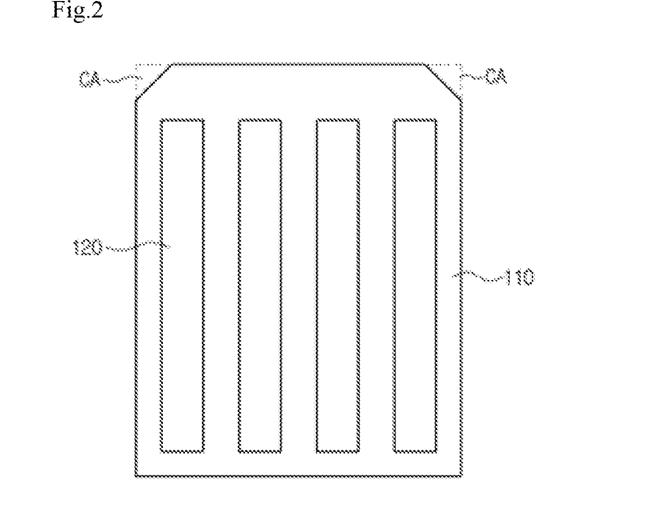
FIG. 2 is a view showing a solar cell panel in a solar battery module according to the embodiment.
Figure 3:
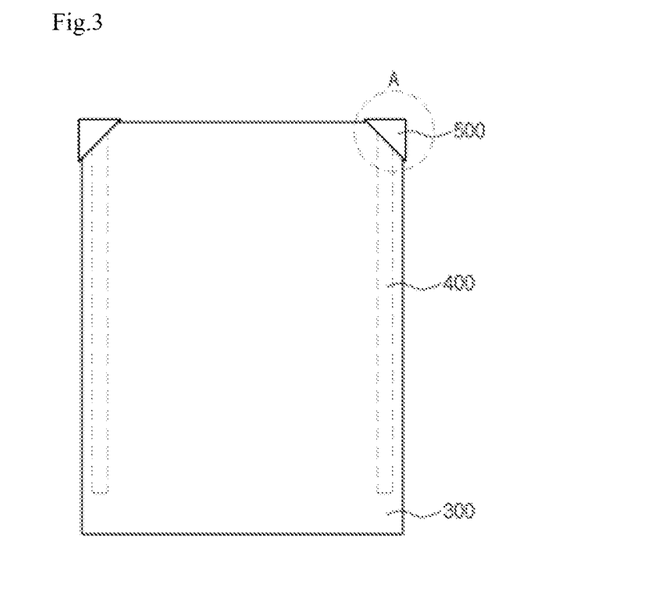
FIG. 3 is a view showing a front surface of the solar battery module according to the embodiment.
Figure 4:
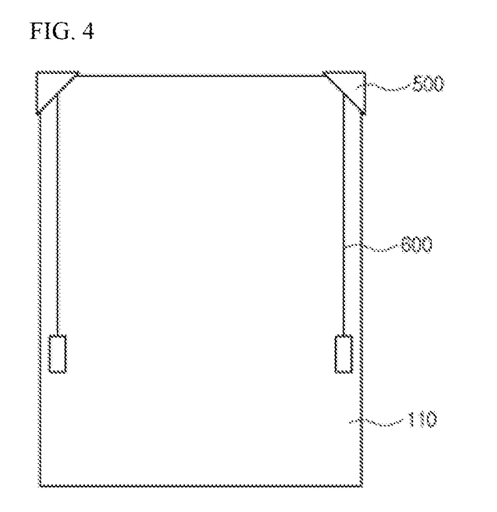
FIG. 4 is a view showing a rear surface of the solar battery module according to the embodiment.
Figure 5:
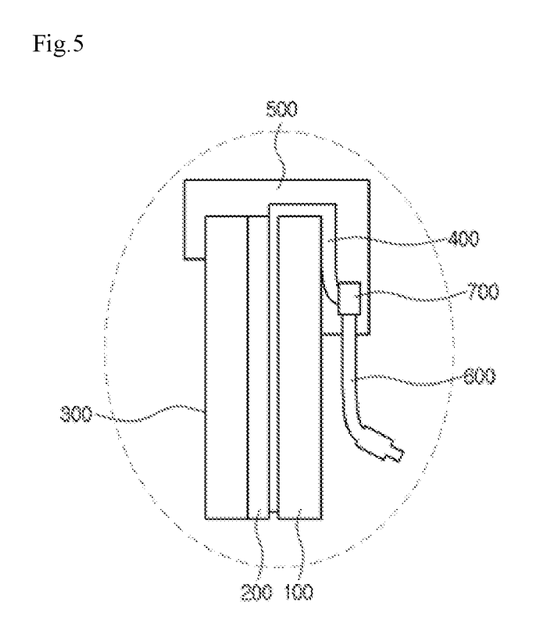
FIG. 5 is a side view showing part A of FIG. 3.

Hereinafter, a solar battery module according to the embodiment will be described in detail with reference to FIGS. 1 to 11. FIG. 1 is an exploded perspective view showing a solar cell module according to an embodiment. FIG. 2 is a view showing a solar cell panel in a solar battery module according to the embodiment. FIG. 3 is a view showing a front surface of the solar battery module according to the embodiment. FIG. 4 is a view showing a rear surface of the solar battery module according to the embodiment. FIG. 5 is a side view showing part A of FIG. 3. FIGS. 6 to 11 are views showing the front and rear surfaces of a solar battery module according to various embodiments.

Referring to FIGS. 1 to 11, a solar cell module 10 according to an embodiment includes a solar cell panel 100, a buffer sheet 200, and a protective substrate 300.

The solar cell panel 100 may have a plate shape. The solar cell panel 100 may include a support substrate 100 and a plurality of solar cells 120 provided on the support substrate 110.

The support substrate 110 may include an insulator. The support substrate 110 may include a glass substrate, a plastic substrate, or a metallic substrate. In more detail, the support substrate 110 may include a soda lime glass substrate. Alternatively, the support substrate 110 may include a ceramic substrate including alumina, stainless steel, or polymer having flexibility. The support substrate 110 may be transparent. The support substrate 110 may be rigid or flexible.

Referring to FIG. 2, the support substrate 110 may have at least two cut regions CA formed at corner regions thereof. In detail, the support substrate 110 may have cut regions CA formed by cutting two corner regions opposite to each other.

The cut region CA may be formed in various shapes. For example, the cut region CA may be formed in various shapes such as a triangular shape, an oval shape, and a rectangular shape.

For example, the solar cells 120 may include a CIGS-based solar cell, a silicon-based solar cell, a dye-sensitized solar cell, a group III-IV compound semiconductor solar cell, or a group III-V compound semiconductor solar cell.

The solar cells 120 may be arranged in the shape of a stripe. In addition, the solar cells 120 may be arranged in various shapes such as a matrix shape.

The bus bar 400 may be provided on the solar cell panel 100. The bus bar 400 may include first and second bus bars 410 and 420. The first and second bus bars 410 and 420 are connected with the solar cells 120. In detail, the first and second bus bars 410 and 420 may be directly connected with the solar cells 120. In more detail, the first and second bus bars 410 and 420 may be electrically connected with the outmost solar cells 120, respectively.

The first and second bus bars 410 and 420 may include a conductive tape or conductive paste. The first and second bus bars 410 and 420 may include a material such as copper (Cu), silver (Ag), or aluminum (Al).

Referring to FIGS. 3 and 4, the bus bars 400 are formed on front and rear surfaces 111 and 112 of the support substrate. In detail, the bus bars 400 may extend to the edge of the rear surface 112 of the support substrate along the edge of the front surface 111 of the support substrate. In detail, the first and second bus bars 410 and 420 may extend to the cut region CA of the support substrate 100 along the edge of the front surface 111 of the solar cell panel 100, and may extend to the edge of the rear surface 112 of the support substrate through the cut region CA.

Accordingly, the first and second bus bars 410 and 420 may extend from the front surface 111 of the support substrate to the rear surface 112 of the support substrate through the cut region CA.

A connection member 500 may be provided in the cut region CA. For example, the connection member 500 may be a junction box.

The connection member 500 may be formed while surrounding the cut region CA. In detail, the connection member 500 may be formed at the cut region CA while surrounding the support substrate 100.

The connection member 500 may surround the bus bars 400. In detail, the connection member 500 may surround the first and second bus bars 410 and 420. In other words, the connection member 500 may be provided while surrounding the first and second bus bars 410 and 420 passing through the cut region CA.

The first and second bus bars 410 and 420 may be connected with a cable 600 at the connection member 500. In detail, the first and second bus bars 410 and 420 may be connected with the cable 600 through a junction part 700 in the connection member 500.

The protective substrate 300 is provided on the solar cell panel 100. In more detail, the protective substrate 300 is provided in opposition to the solar cell panel 100. One lateral side of the protective substrate 300 may be arranged in line with one lateral side of the solar cell panel 100. One lateral side of the protective substrate 300 may not make a step difference from one lateral side of the solar cell panel 100.

The protective substrate 300 is transparent and has stronger strength. The protective substrate 300 may include tempered glass.

The buffer sheet 200 is interposed between the protective substrate 300 and the solar cell panel 100. The buffer sheet 200 protects the solar cell panel 100 from external physical impact. In addition, the buffer sheet 200 prevents the protective substrate 300 from directly colliding with the solar cell panel 100.

In addition, the buffer sheet 200 may cover the solar cells 120. The buffer sheet 200 may encapsulate the solar cells 120. The buffer sheet 200 may protect external chemical shock.

The buffer sheet 200 may perform an anti-reflection function so that a larger amount of light is incident onto the solar cell panel 100.

The buffer sheet 200 may include an insulator. In more detail, the buffer sheet 200 may be formed an insulator. For example, the buffer sheet 200 may include a material, such as ethylenevinylacetate resin (EVA resin). In other words, the buffer sheet 200 is an insulating layer.

FIG. 5 is a side view showing part A of FIG. 3. Referring to FIG. 4, the bus bars 400 are formed on the front surface of solar cell panel 100, and extend to the rear surface of the solar cell panel through the cut region of the corner region.

The bus bars 400 may extend from the front surface to the rear surface of the solar cell panel through the corner region and may be surrounded by the connection member 500 in the corner region. In other words, the bus bars 400 extend from the front surface of the solar cell panel 100 to the rear surface of the solar cell panel 100 through the cut region, and the bus bars 400 formed on the rear surface are surrounded by the connection member 500.

The connection member 500 may be formed while surrounding the solar cell panel 100, the buffer sheet 200, and the protective substrate 300.

The bus bars 400 may be connected with the cable 600 through the junction part 700 in the connection member 500.

In the solar battery module according to the embodiment, a bus bar may extend from a front surface of a solar cell panel to a rear surface of the solar cell panel through a cut region formed at a corner region of a support substrate.

In other words, the bus bar can directly extend from the front surface of the solar cell panel to the rear surface of the solar cell panel without any connection passages such as holes formed in the support substrate.

According to the related art, a through-hole is formed through the support substrate, and the bus bar extends to the rear surface of the support substrate through the through-hole. However, due to the through-hole, the durability of the support substrate is deteriorated. In addition, as a size of the solar cell panel is enlarged, the solar cell panel may be deformed, damaged or warped due to deterioration of the durability.

Therefore, according to the solar cell module of the embodiment, the bus bar directly extends from the front surface of the solar cell panel to the rear surface of the solar cell panel without through-holes formed in the support substrate, so that the durability of the solar cell module can be improved.

Therefore, the solar cell module according to the embodiment may be prevented from being bent or warped.

FIGS. 6 to 11 are views showing front and rear surfaces of a solar battery module according to various embodiments.

FIGS. 6 to 9 are views showing the front surface of the solar battery module. Referring to FIGS. 6 to 9, a cut region is formed in a corner region of the solar battery module, and a buffer sheet 200 and a protective substrate 300 cover the cut region.

Figure 6:
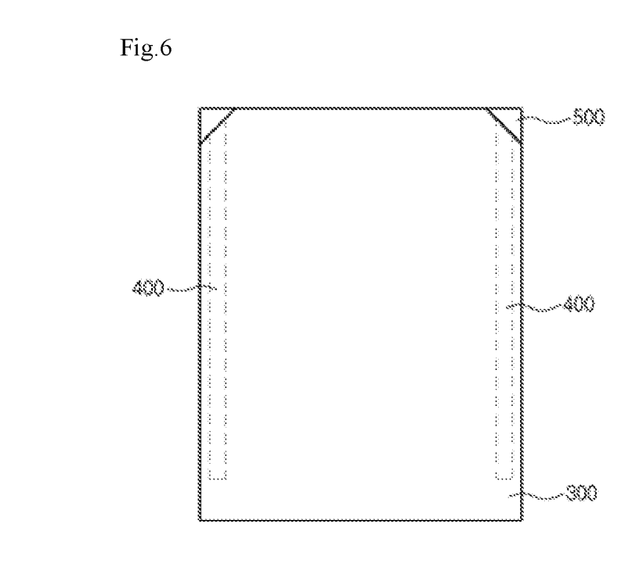
FIGS. 6 to 11 are views showing the front and rear surfaces of a solar battery module according to various embodiments.
Figure 7:
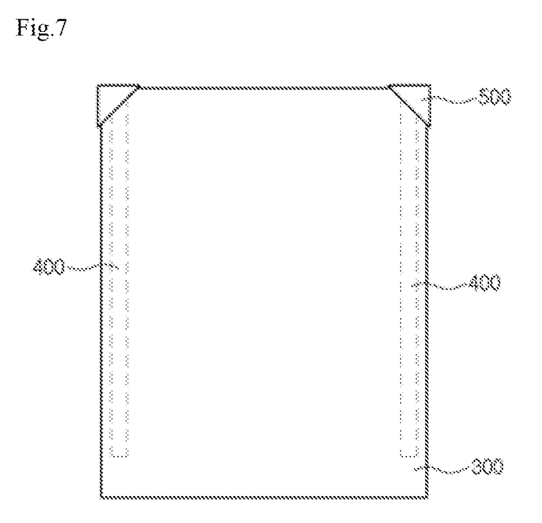
Figure 8:
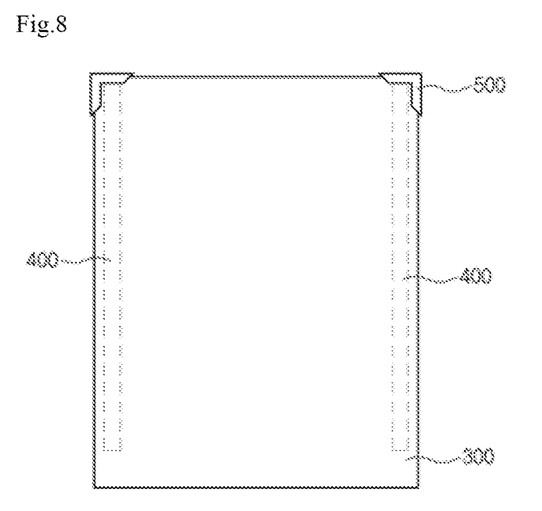

Referring to FIGS. 6 to 8, a connection member 500 may be formed while surrounding the solar cell panel 100, the buffer sheet 200, and the protective substrate 300. In other words, the connection member 500 may extend from the rear surface of the solar cell panel 100 to the front surface of the protective substrate 300. In other words, the connection member 500 may be formed on the front surface, the lateral side, and the rear surface of the solar battery module.

The connection member 500 may be formed in the same shape as that of the cut region, or in the shape of a reverse L. In addition, the edge of the connection member 500 may be arranged in line with the edge of the solar cell panel or may protrude from the edge of the solar cell panel.

Figure 9:
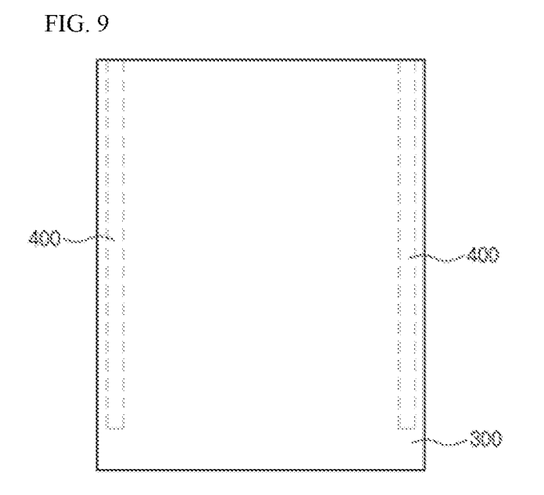

In addition, referring to FIG. 9, the connection member 500 may be formed while surrounding the solar cell panel 100, the buffer sheet 200, and the protective substrate 300. In other words, the connection member 500 may extend from the rear surface of the solar cell panel 100 to lateral sides of the solar cell panel 100, the buffer sheet 200, and the protective substrate 300. In other words, the connection member 500 may be formed only on the rear surface and the lateral side of the solar battery module.

Figure 10:
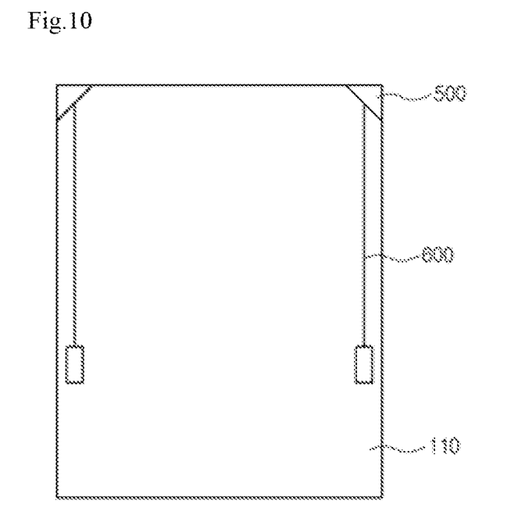
Figure 11:
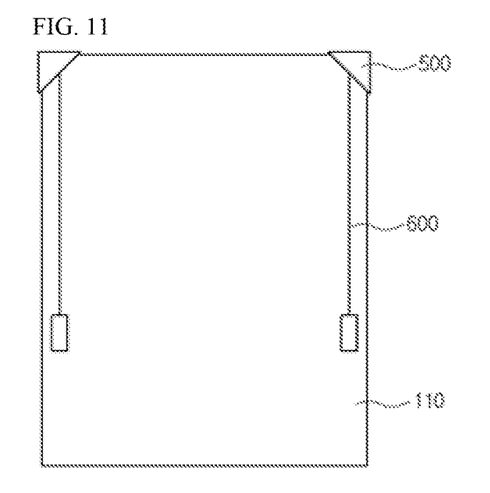

FIGS. 10 and 11 are views showing the rear surface of the solar battery module, that is, the rear surface of the solar cell panel. Referring to FIGS. 10 and 11, the bus bar may be connected with a cable in the connection member 500 formed in the cut region, and the cable extends from the connection member to the rear surface of the solar cell panel 100.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
   a support substrate;
   a plurality of solar cells on a front surface of the support substrate; and
   a plurality of bus bars electrically connected with the solar cells,
   wherein the solar cells comprise a first solar cell and a second solar cell disposed adjacent to the first solar cell,
   wherein the bus bars comprise a first bus bar electrically connected with the first solar cell, and a second bus bar electrically connected with the second solar cell,
   wherein the support substrate comprises a plurality of corner regions and cut regions,
   wherein the cut regions comprise a first cut region and a second cut region removed from each corner region and spaced apart from each other,
   wherein the first cut region and the second cut region do not overlap when viewed from the front surface of the support substrate,
   wherein the first bus bar extends from a front surface of the support substrate to a rear surface of the support substrate through the first cut region, and the second bus bar extends from a front surface of the support substrate to a rear surface of the support substrate through the second cut region,
   wherein the first bus bar directly makes contact with the front surface of the support substrate, the first cut region, and the rear surface of the support substrate;
   wherein the first cut region is provided with a first junction box,
   wherein the first junction box is provided while surrounding the first cut region and the first bus bar,
   wherein the first junction box directly makes contact with the first cut region, the first bus bar, and the rear surface of the support substrate; and
   wherein an edge of the first junction box is formed in line with an edge of the support substrate when viewed from the front surface of the support substrate.

2. The solar cell module of claim 1, wherein the bus bar is connected with the first junction box on the rear surface of the support substrate.

3. The solar cell module of claim 1, wherein the bus bar is connected with a cable in the first junction box.

4. The solar cell module of claim 1, wherein the first junction box is formed in the same shape as that of the first cut region.

5. The solar cell module of claim 1, wherein the first junction box is provided while surrounding the first bus bar passing through the first cut region,
   wherein the second cut region is provided with a second junction box,
   wherein the second junction box is provided while surrounding the second cut region, and
   wherein the second junction box is provided while surrounding the second bus bar passing through the second cut region.

6. The solar cell module of claim 1, further comprising a protective substrate on a solar cell panel including the support substrate and the solar cells, and a buffer sheet interposed between the solar cell panel and the protective substrate;

wherein the first junction box is formed while surrounding the solar cell panel, the buffer sheet, and the protective substrate.

7. The solar cell module of claim 6, wherein one lateral side of the protective substrate is arranged in line with one lateral side of the solar cell panel.

8. The solar module of claim 6, wherein the buffer sheet and the protective substrate cover the cut region.

9. The solar cell module of claim 1, wherein the first junction box is formed only on the rear surface and the lateral side of the solar cell panel.

\* \* \* \* \*